US008968972B2

(12) United States Patent
Yoshikawa et al.

(10) Patent No.: US 8,968,972 B2
(45) Date of Patent: Mar. 3, 2015

(54) PHOTOMASK BLANK, PROCESS FOR PRODUCTION OF PHOTOMASK, AND CHROMIUM-CONTAINING MATERIAL FILM

(75) Inventors: Hiroki Yoshikawa, Niigata (JP); Souichi Fukaya, Niigata (JP); Yukio Inazuki, Niigata (JP); Tsuneo Yamamoto, Niigata (JP); Hideo Nakagawa, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/883,850

(22) PCT Filed: Nov. 18, 2011

(86) PCT No.: PCT/JP2011/006422
§ 371 (c)(1),
(2), (4) Date: May 7, 2013

(87) PCT Pub. No.: WO2012/070209
PCT Pub. Date: May 31, 2012

(65) Prior Publication Data
US 2013/0230796 A1    Sep. 5, 2013

(30) Foreign Application Priority Data

Nov. 22, 2010  (JP) ................................ 2010-259675
Jun. 7, 2011   (JP) ................................ 2011-127511

(51) Int. Cl.
*G03F 1/50* (2012.01)
*C22C 27/06* (2006.01)
(Continued)

(52) U.S. Cl.
CPC . *G03F 1/50* (2013.01); *C22C 27/06* (2013.01);
*G03F 1/54* (2013.01); *G03F 1/80* (2013.01);
*C23C 14/0641* (2013.01); *C23C 14/0676*
(2013.01); *G03F 1/30* (2013.01)
USPC ................................................ 430/5; 428/433

(58) Field of Classification Search
USPC ................. 430/5, 322, 323; 428/428, 433
See application file for complete search history.

(56) References Cited

U.S. PATENT DOCUMENTS 5,474,864 A   12/1995   Isao et al.
5,750,290 A    5/1998   Yasuzato et al.
(Continued)

FOREIGN PATENT DOCUMENTS

CN    1900819 A       1/2007
EP    1 847 874 A2   10/2007
(Continued)

OTHER PUBLICATIONS

International Search Report Issued Dec. 27, 2011 in PCT/JP11/06422 Filed Nov. 18, 2011.
(Continued)

*Primary Examiner* — Stephen Rosasco
(74) *Attorney, Agent, or Firm* — Oblon, Spivak, McClelland, Maier & Neustadt, L.L.P.

(57) ABSTRACT

In the chromium-containing material film of the present invention, an element is added thereto and is capable of bringing a mixture of the element and the chromium into a liquid phase at a temperature of 400° C. or lower. The use of such a chromium-containing material film as an optical film (e.g., a light-shielding film, an etching mask film, or an etching stopper film) of a photo mask blank can achieve an improvement in chlorine-dry etching while retaining the same optical characteristics and the like as those of the conventional chromium-containing material film, thereby increasing the patterning precision.

20 Claims, 2 Drawing Sheets

(51) Int. Cl.
*G03F 1/54* (2012.01)
*G03F 1/80* (2012.01)
*C23C 14/06* (2006.01)
*G03F 1/30* (2012.01)

(56) References Cited

U.S. PATENT DOCUMENTS

| | | | |
|---|---|---|---|
| 6,869,736 B2 * | 3/2005 | Nakagawa et al. | ............... 430/5 |
| 2001/0044054 A1 | 11/2001 | Kaneko et al. | |
| 2003/0186135 A1 | 10/2003 | Nakagawa et al. | |
| 2006/0088774 A1 | 4/2006 | Yoshikawa et al. | |
| 2006/0251973 A1 | 11/2006 | Takaki et al. | |
| 2007/0212618 A1 | 9/2007 | Yoshikawa et al. | |
| 2007/0212619 A1 | 9/2007 | Yoshikawa et al. | |
| 2008/0063950 A1 | 3/2008 | Yoshikawa et al. | |
| 2010/0083985 A1 | 4/2010 | Numanami | |

FOREIGN PATENT DOCUMENTS

| | | |
|---|---|---|
| EP | 2 237 107 A2 | 10/2010 |
| JP | 63 58446 | 3/1988 |
| JP | 5 257264 | 10/1993 |
| JP | 7 140635 | 6/1995 |
| JP | 8 292549 | 11/1996 |
| JP | 2001-305713 A | 11/2001 |
| JP | 2005 200682 | 7/2005 |
| JP | 2007 33470 | 2/2007 |
| JP | 2007 241060 | 9/2007 |
| JP | 2007 241065 | 9/2007 |
| JP | 2009 92823 | 4/2009 |
| KR | 10-2007-0073244 | 7/2007 |
| KR | 10-2007-0096922 | 10/2007 |
| TW | 2006/23233 A | 7/2006 |
| TW | 201015628 A | 4/2010 |
| WO | 02/21210 A1 | 3/2002 |
| WO | 2007 074806 | 7/2007 |

OTHER PUBLICATIONS

Office Action dated Jan. 8, 2014 issued in corresponding Taiwanese patent application No. 100142330.
Decision to Patent issued in corresponding Korean patent application No. 10-2013-7016115 dated Jan. 27, 2014.
Liu et al.—"Physical properties of polycrystalline Cr-doped $SnO_2$ films grown on glasses using reactive dc magnetron co-sputtering technique", Applied Surface Science, vol. 257, No. 6, 2011, pp. 2254-2258.
Chang et al.—"Opto-electronic properties of chromium doped indium-tin-oxide films deposited at room temperature", Materials Science and Egineering B, vol. 153, No. 1-3, Sep. 25, 2008, pp. 57-61.
Okamoto "Cr-Hg to Cr-Te" Jan. 1, 2000, Desk Handbook Phase Diagrams for Binary Alloys, pp. 268-281.
Extended European Search Report issued in corresponding EP patent application No. 11843140.2 dated Apr. 17, 2014.
Office Action issued in Corresponding Chinese patent application No. 201180056117.6 dated Apr. 14, 2014 (with English translation).

\* cited by examiner

PHOTOMASK BLANK, PROCESS FOR PRODUCTION OF PHOTOMASK, AND CHROMIUM-CONTAINING MATERIAL FILM

CROSS REFERENCE TO RELATED APPLICATIONS

The present application is a 35 U.S.C. §371 national stage patent application of International patent application PCT/JP2011/006422, filed on Nov. 18, 2011, published as WO/2012/070209 on May 31, 2012, the text of which is incorporated by reference, and claims the benefit of the filing date of Japanese application nos. 2010-259675 and 2011-127511, filed on Nov. 22, 2010 and Jun. 7, 2011, respectively, the text of both of which is also incorporated by reference.

TECHNICAL FIELD

The present invention relates to a technique for manufacturing a photo mask. More specifically, the present invention relates to a photo mask blank used in production of a photo mask to be employed for microfabrication of an integrated circuit, a CCD (charge-coupled device) color filter, a LCD (liquid crystal display) color filter, a magnetic head, or the like, and to a chromium-containing material film serving as a structural component thereof.

BACKGROUND ART

A microfabrication technique is a very important basic technique in the field of semiconductor technology, and the research and development thereof have been progressed for further finer microfabrication. In recent years, in particular, the degree of request for microfabrication technique is becoming more than ever with respect to the high integration of a large scale integration circuit because of finer circuit patterns and finer wiring a pattern, a finer pattern of contact holes for interlayer wiring of a cell, and the like.

In view of such a circumstance, in the field of a photo mask production technique used in a photolithography step in the microfabrication as described above, a technique for writing a fine and correct circuit pattern (mask pattern) also becomes being demanded in the field of a photo mask production technique.

In order to form a highly precise mask pattern, it is required to form a highly precise resist pattern on a photo mask blank. Generally, reduction projection is performed when forming a pattern on a semiconductor substrate by photolithographic technique. The size of the pattern formed on the photo mask is therefore approximately four times larger than the side of the pattern formed on the semiconductor substrate. However, this does not mean that the desired precision of the pattern formed on the photo mask is smaller than the pattern formed on the semiconductor substrate. Rather, the precision of a pattern formed on the photo mask as a master disc is desired to be more than an actual pattern obtained after exposure.

In today's photolithography technical field, the size of a circuit pattern to be drawn is considerably smaller than the wavelength of light to be used for exposure. Thus, in the case of forming a photo mask pattern with a just four-times larger circuit pattern, light interference or the like, which is generated under exposure, influences on transfer of an original shape. As a result, the original shape cannot be transferred onto the resist film of a photo mask blank.

In order to reduce such influence, therefore, it may be necessary to process a photo mask pattern into a shape more complicated than the actual circuit pattern. The shape may be, for example, a shape subjected to optical proximity correction (OPC).

Accordingly, a more precision processing technique has been also desired in a lithographic technique for forming a photo mask pattern. In some cases, lithography performance is expressed in resolution limit. As described above, however, a pattern formed on a photo mask as a master disc desires more precision than an actual pattern formed after exposure. Thus, resolution limit required for formation of a photo mask pattern is almost equal to or more than one required in lithography for forming a pattern on a semiconductor base.

In general, when forming a photo mask pattern, a resist film is formed on the surface of the photo mask blank in which a light-shielding film is mounted on a transparent substrate, and a pattern is then drawn (exposed) on the resist film by an electron beam. Subsequently, after obtaining a rest pattern after developing the exposed resist film, the light-shielding film is etched by using this resist pattern as a mask to obtain a light-shielding (film) pattern. The light-shielding (film) pattern thus obtained is served as a photo mask pattern.

In this case, the above resist film should be thinned depending on the degree of fineness of the light-shielding pattern. This is because, when forming a fine light-shielding pattern while keeping the thickness of the resist film, the ratio (aspect ratio) of the thickness of the resist film to the size of the light-shielding pattern becomes large and causes troubles of unsatisfied pattern transfer due to degraded shape of the resist pattern, collapse or peel of the resist pattern, or the like.

As a material of the light-shielding film mounted on the transparent substrate, many kinds of materials have so far been proposed. Among them, however, a chromium compound has been practically used because of much know-how on etching, for example.

Dry etching of a chromium-containing material film is generally performed by chlorine-containing dry etching. In many cases, however, chlorine-containing dry etching has a certain level of ability to etch an organic layer. In the case that a resist pattern for etching a light-shielding film is formed on a thin resist film, therefore, the resist pattern is etched too much to ignore by chlorine-containing dry etching. As a result, the proper resist pattern cannot be correctly transferred to the light-shielding film.

Hence, a resist material having excellent etching resistance has been requested. In practice, however, such a resist material has not been known yet. For this reason, to obtain a light-shielding (film) pattern having high resolution property, a light-shielding film material having more processing accuracy has been reexamined.

As a specific effort to reexamine the light-shielding film material having more processing accuracy, there is reported an attempt to increase the etching rate of a light-shielding film by allowing a chromium compound serving as a light-shielding film material to contain only a predetermined amount of a light element (see, for example, Patent Literature 1 and Patent Literature 2).

Patent Literature 1 (WO 2007/74806 A) discloses a technique that uses a material mainly containing chromium (Cr) and nitrogen (N) and having an X-ray diffraction peak of substantially CrN (200) as a light-shielding film material to suppress a decrease in thickness of a resist film by increasing the dry etching rate of the light-shielding film.

Furthermore, Patent Literature 2 (JP 2007-33470 A) discloses the invention of a photo mask blank where the composition of a light-shielding film formed of a chromium-containing compound is made rich in light element and low in chromium composition as compared with the composition of the conventional film so that the composition, film thickness, and laminated structure of the photo mask blank can be suitably designed to obtain desired transmittance T and reflectance R while trying to increase the dry etching rate of the light-shielding film.

CITATION LIST

Patent Literatures

Patent Literature 1: WO 2007/74806 A
Patent Literature 2: JP 2007-33470 A
Patent Literature 3: JP 2005-200682 A
Patent Literature 4: JP 08-292549 A
Patent Literature 5: JP 07-140635 A
Patent Literature 6: JP 2007-241060 A
Patent Literature 7: JP 2007-241065 A

SUMMARY OF THE INVENTION

Technical Program

However, the technique as described above, where a light element is added to a chromium-containing compound to suppress a decrease in thickness of a resist film by increasing the dry-etching rate of a light-shielding film, has the following disadvantage:

When using a chromium-containing compound as a light-shielding film, the light-shielding film is demanded not only to ensure its improved etching rate but also to ensure predetermined optical characteristics because the light-shielding film is also served as an optical film. The flexibility of the film design enough to simultaneously satisfy both demands is not always high.

Even in the case of using a chromium-containing compound as a film material for forming an etching mask for processing a light-shielding film but not as a light-shielding film material, a range of amount of a light element which can be added is naturally limited to ensure the functional aspect of the chromium-containing compound. Thus, the flexibility of a film design is not always high.

From these facts, it is desired to provide a technique for improving the etching rate of a film made of a chromium-based material by an approach which is different from the conventional approach of light-element addition.

The present invention has been made in consideration of the above problem and its object resides in providing a novel technique that can increase a dry-etching rate of a film made of a chromium-containing material while assuring the design flexibility thereof.

Solution to Problem

In order to solve the above problem, a photo mask blank according to a first aspect of the present invention includes a chromium-containing material film that contains chromium as a metal element, where the chromium-containing material film is added with an element that is capable of bringing a mixture of the element and the chromium into a liquid phase at a temperature of 400° C. or lower.

Preferably, the chromium-containing material film has a region in a thickness direction thereof to which the element is added at a concentration of 0.01 atomic % to 20 atomic %.

Preferably, furthermore, the region in the thickness direction has a thickness of 50% or more of the total film thickness of the chromium-containing material film.

The element added is indium or tin, for example.

Furthermore, the chromium-containing material is, for example, any one of a chromium metal, a chromium oxide, a chromium nitride, a chromium carbide, a chromium oxynitride, a chromium oxycarbide, a chromium carbonitride, and a chromium oxycarbonitride.

The chromium-containing material film is, for example, any one of a light-shielding film, an etching mask film, and an etching stopper film.

The light-shielding layer may be configured to have a laminated structure of an antireflection layer and a light shielding layer. At least one of the antireflection layer and the light-shielding layer may be configured to have an area to which an element is added at a concentration of 0.01 atomic % to 20 atomic % and is capable of bringing a mixture of the element and the chromium into a liquid phase at a temperature of 400° C. or lower.

Preferably, the ratio ($R_{Cl}/R_F$) of a chlorine-containing dry etching rate ($R_{Cl}$) on the above chromium-containing material film and a fluorine-containing dry etching rate ($R_F$) is large compared with a chromium-containing film to which the above element, which is brought into a liquid phase at 400° C. or lower, is not added.

The chromium-containing material film is formed by, for example, co-sputtering by which a chromium target and a target containing the element are simultaneously sputtered.

A photo mask blank according to a second aspect of the present invention include a chromium-containing material film, where the chromium-containing material film has a region in a thickness direction thereof containing tin at a concentration of 0.5 atomic % or more.

For instance, the aspect may be configured to include the chromium-containing material film as a light-shielding layer, where the light-shielding film has a laminated structure of an antireflection layer and a light-shielding layer, and at least one of the antireflection layer and the light-shielding layer contains tin.

A method for manufacturing a photo mask according to the present invention is characterized by comprising a step of using the above photo mask blank to pattern the chromium-containing material film with a gas mixture containing at least chlorine and oxygen.

Advantageous Effects of Invention

In the chromium-containing material film of the present invention, an element is added thereto and is capable of bringing a mixture of the element and the chromium into a liquid phase at a temperature of 400° C. or lower. Comparing with the conventional chromium-containing metal film, therefore, an etching rate during the chlorine-containing dry etching simultaneously including chlorine and oxygen is improved.

The use of such a chromium-containing material film as an optical film (e.g., a light-shielding film, an etching mask film, or an etching stopper film) of a photo mask blank can achieve an improvement in chlorine-dry etching while retaining the same optical characteristics and the like as those of the conventional chromium-containing material film, thereby increasing the patterning precision.

DESCRIPTION OF EMBODIMENTS

Figure 1:
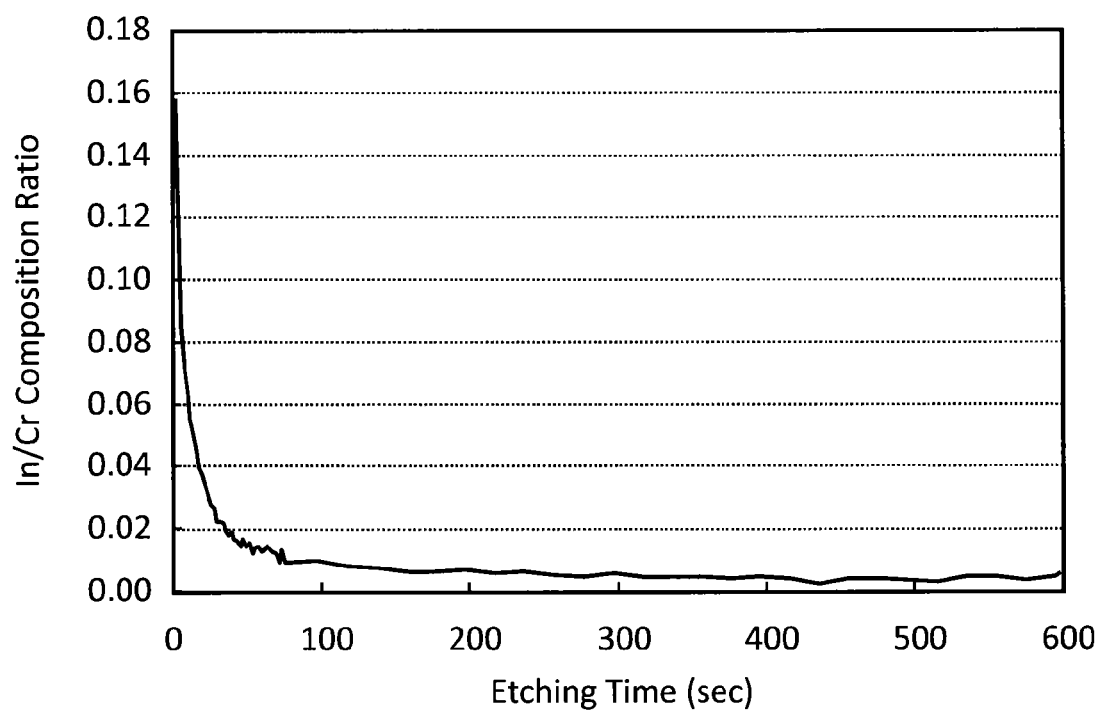
FIG. 1 is a diagram illustrating results of investigating distribution of indium in a chromium-containing material obtained from a chromium-indium complex target by using electron spectroscopy for chemical analysis (ESCA).

Hereinafter, an embodiment of the present invention will be described with reference to drawings.

Chromium-containing materials have been widely used as optical film materials because of their comparatively good chemical stability. Furthermore, since chromium-containing materials have high resistance to fluorine-containing etching gas, such materials can be reliably used as masks for patterning silicon-containing materials when the silicon-containing materials are subjected to fluorine-containing dry-etching.

Here, examples of a chromium-containing material (base material) can include a chromium metal, chromium oxide, a chromium nitride, a chromium carbide, a chromium oxynitride, a chromium oxide carbide, a chromium nitride carbide, and a chromium oxide nitride carbide. In the present invention, a chlorine-containing dry etching rate can be increased by incorporating an element into these base materials, where the element is capable of bringing a mixture of the element and the chromium into a liquid phase at a temperature of 400° C. or lower.

However, the patterning of a chromium-containing material film is generally performed by chlorine-containing dry etching simultaneously containing oxygen and chlorine. A resist for patterning is etched by the chlorine-containing dry etching to an unignorable extent, and as a result it becomes difficult to carry out the patterning of the chromium-containing material film with high accuracy.

Incidentally, although the chromium-containing material film is formed by sputtering, a desirable chromium target to be used in film formation is of high purity. In general, this is due to the reasons of, for example, an empirically known fact that a metal impurity in the chromium-containing material film leads to a decrease in etching rate of the film. Furthermore, JP 2005-200682 A (Patent Literature 3) describes that a sputtering target can be a source of indium contaminant generated during the film formation when the target shifts from a backing plate.

As for indium or tin, JP 08-292549 A (Patent Literature 4) describes that examples of a material that is hardly etched even by dry etching with fluorine gas include ITO (indium tin oxide) as well as alumina and tin oxide, and the ITO can be used as an etching stopper.

The present inventors have repeatedly performed various examinations on a novel procedure for increasing the dry-etching rate of a film made of a chromium-containing material while assuring design flexibility of the film. The present invention has completed by finding that a chlorine-containing dry etching rate can be increased by addition of an element into a chromium-containing film, where the element is capable of bringing a mixture of the element and the chromium into a liquid phase at a temperature of 400° C. or lower.

As is evident from examples described later, when an element is added to a chromium-containing material film, where the element is capable of bringing a mixture of the element and the chromium into a liquid phase at a temperature of 400° C. or lower, the etching rate during chlorine-containing dry etching on the chromium-containing material film increases as compared with that of a chromium metal film (i.e., a clear time is shorten). On the other hand, as is evident from comparative examples described later, when an element is added to a chromium-containing material film, where the element is capable of bringing a mixture of the element and the chromium into a liquid phase at a temperature of higher than 400° C., the etching rate during chlorine-containing dry etching on the chromium-containing material film decreases as compared with that of a chromium metal film (i.e., a clear time is extended). In some cases, it is no longer etched.

Examples of an element that is capable of bringing a mixture of the element and the chromium into a liquid phase at a temperature of 400° C. or lower can include indium ($T_L$=157° C.), tin ($T_L$=232° C.), and bismuth ($T_L$=271° C.), and also include thallium, lithium, sodium, potassium, and mercury. Here, the temperature ($T_L$) at which the mixture is brought into a liquid phase is a value at ordinary pressure.

Examples of the element capable of bringing a mixture of the element and the chromium into a liquid phase at a temperature of higher than 400° C. can include nickel ($T_L$=487° C.) and copper ($T_L$=1077° C.). Furthermore, the temperature that allows the mixture with chromium to form a liquid phase can be determined from a phase diagram.

Under the chlorine-containing dry etching conditions, an element to be added to a chromium-containing material film is more preferably one capable of bringing a mixture of the element and the chromium into a liquid phase at a temperature ($T_L$) of 250° C. or lower. In the present invention, furthermore, the lower limit of the temperature ($T_L$) at which the mixture is brought into a liquid phase is not particularly limited. However, it is more preferable to set the temperature ($T_L$) for causing a liquid phase to ordinary temperature or higher, thereby making handling easier.

In particular, the boiling points of indium and tin are higher than the melting point of chromium, so that indium and tin are preferred in the viewpoint of ease of preparing an alloy target or a mixture target with chromium.

In other words, conventionally, film formation of a chromium-containing material film is designed to avoid contamination of metal impurities in the chromium-containing material film by using a high-purity chromium target. On the other hand, in the present invention, based on the completely novel finding of the present inventors as described above, an element capable of bringing a mixture of the element and the chromium into a liquid phase at a temperature of 400° C. or lower is consciously added to a chromium-containing material film to increase a chlorine-containing dry etching rate while keeping the optical characteristics of the chromium-containing material film.

With respect to the reasons why such effects can be obtained, the present inventors recognize as follows:

When carrying out dry etching of a chromium-containing material film, plasma added with chlorine and oxygen as reactive gas is used. Such an etching reaction is generally a gas phase-solid phase reaction. However, the etching reaction is considered as a process where, in order to advance this reaction, a gas element (gas substance) should be adsorbed on the surface of a solid at first and then the element of the solid excited with the energy of plasma reacts with the adsorbed gas substance.

If an extremely thin liquid gas phase is present on the surface of the solid, the gas element is absorbed into the liquid phase. Substantially, therefore, the same behavior as that of an increase in amount of adsorbed gas can be expected. In other words, the substance that forms a liquid phase by heating with plasma during the dry etching can be expected to increase the dry-etching rate of the chromium-containing material film.

Here, although the plasma temperature is extremely high, the density itself is extremely low. Thus, only the extreme surface layer of the dry-etching target is heated. As a result, a temperature profile is considered to be formed such that temperature rapidly falls from the surface of the dry-etching target to the depth thereof. Under such a temperature profile, a liquid phase formed on the surface of the dry-etching target is considered to become deeper (thicker) as the liquid-phase forming temperature lowers. That is, it is considered that the liquid phase is formed more deeply as the liquid-phase temperature is lower, and then the reaction takes place efficiently.

In the chromium-containing material film of the present invention, the content (concentration) of the element added is preferably 0.01 to 20 atomic %, more preferably 0.5 to 20 atomic %. In particular, when the element added is tin, the concentration range is preferably 0.5 to 20 atomic %, more preferably 1 to 20 atomic %.

Furthermore, the above concentration range is not always necessary for the entire chromium-containing material film. The chromium-containing material film may have a region where the element is added in an amount within the above concentration range in the thickness direction of the chromium-containing material film. Furthermore, such a region in the thickness direction may have a thickness of 50% or more of the entire film thickness of the chromium-containing material film to increase the precision of the patterning while the thickness of a resist during the dry etching can be decreased by improving the etching rate. Furthermore, in the chromium-containing material film, the content (concentration) of the above element added is preferably 0.01 to 30 atomic %, more preferably 0.01 to 20 atomic % as a range with respect to chromium in the chromium-based material film.

When the content (concentration) of the above element added in the chromium-containing material film is 0.01 to 20 atomic %, substantially the same chemical characteristics and optical characteristics as those of the chromium-containing material film (chromium-metal film) to which the above element is not added can be obtained. Thus, it becomes possible to increase the etching rate during the chlorine-containing dry etching while keeping substantially the same various characteristics as those of the conventionally designed chromium-containing film. Furthermore, if the content (concentration) of the element added becomes less than 0.01 atomic %, expression of an effect of increasing the etching rate during the chlorine-containing dry etching may become insufficient.

The element added does not need to be uniformly distributed in the chromium-containing material film, and it may have a profile having a change in concentration in the thickness (depth) direction of the film. Furthermore, the chromium-containing material film of the present invention does not need to be a uniform composition film, and it may have a structure in which a plurality of films having different compositions is stacked one on top of the other.

For example, it may be a composite film prepared by stacking a chromium-containing material film containing the above element added in the above concentration range and a chromium-containing material film without containing the above element. In the chromium-containing material film of such a laminated structure, for example, a lower layer may be a chromium-containing film added with an element capable of bringing a mixture of the element and the chromium into a liquid phase at a temperature of 400° C. or lower, and an upper layer may be provided as a chromium-containing material film without containing such an element. In this case, only the dry-etching rate of the lower layer can be increased.

By applying such a configuration to a light-shielding film provided to a photo mask blank, for example, another embodiment may be configured to make the light-shielding film into a laminated structure including an antireflection layer and a light-shielding layer, and at least one of the antireflection layer and the light-shielding layer is designed to have a region have a region to which an element is added at a concentration of 0.01 atomic % to 20 atomic % relative to chromium, and the element is capable of bringing a mixture of the element and the chromium into a liquid phase at a temperature of 400° C. or lower.

In the case that the element added is tin, for example, another embodiment may be configured such that a light-shielding film is provided as a laminated structure of an antireflection layer and a light-shielding layer, and at least one of the antireflection layer and the light-shielding layer has a region containing 0.5 atomic % or more of tin.

The chromium-containing material film of the present invention may be configured in any of other various variations. A plurality of chromium-containing films, where an element is added to the chromium-containing film and is capable of bringing a mixture of the element and the chromium into a liquid phase at a temperature of 400° C. or lower, may be stacked one on top of the other, and each of the chromium-containing material may include the above element in different concentrations, respectively.

The chromium-containing material film used in the photo mask blank of the present invention preferably has a larger ratio ($R_{Cl}/R_F$) of a chlorine-containing dry etching rate ($R_{Cl}$) to a fluorine-containing dry etching rate ($R_F$) than that of a chromium-containing material film without the addition of the above element by which a liquid phase is formed at a temperature of 400° C. or lower.

For example, it is preferred that the above etching rate ratio ($R_{Cl}/R_F$) of the above etching is 11 or more. Here, the etching rate ratio is expressed by the inverse number of a clear time at etching under each etching condition. Thus, the shorter the clear time is, the quicker (more) the etching rate is. The chromium-containing material film having such etching characteristics allows itself to obtain characteristic features suitable for the use thereof as an etching stopper film or an etching mask film (hard surface mask blank).

Although the chromium-containing material film of the present invention can be obtained by a publicly known method for film formation, the use of a sputtering method, such as a DC-sputtering method or a RF-sputtering method, the film having excellent homogeneity can be obtained in a most easy manner.

When carrying out the sputtering film-formation of the chromium-containing material film of the present invention, a target to be used may be one containing an additive element in advance. However, co-sputtering may be carried out so that a chromium target and the target containing the element added can be simultaneously sputtered. A target used may be a single target (complex target) that includes a chromium region and a region containing the element added. Furthermore, co-sputtering may be carried out using both the above complex target and the chromium target. Furthermore, co-sputtering is preferable for changing the concentration of the element added in the thickness direction of the chromium-containing material film.

When incorporating an additive element into the sputtering target, the additive element may be added as a metal or may be added in the form of a compound such as oxide or nitride.

In the case of carrying out co-sputtering using a plurality of targets, the amount (concentration) of an element to be added to the chromium-containing material film can be adjusted not only by controlling the surface area ratios of the respective targets but also by controlling electric power to be applied to each target.

The sputtering gas used in film formation of the chromium-containing material film of the present invention is suitably selected according to the composition of the film. For example, only argon gas may be used when a chromium-containing material film does not contain a light element. In the case of film formation of a chromium-containing material film containing a light element, reactive sputtering may be carried out in one or more kinds of reactive gas, such as nitrogen gas, nitrogen oxide gas, oxygen gas, carbon oxide gas, or hydrocarbon gas, or a gas mixture of any of those reactive gas and inert gas such as argon (see, for example, JP 07-140635 A (Patent Literature 5)).

A gas flow rate during sputtering is suitably adjusted. The flow rate may be constant during film formation, or may be changed depending on the desired composition when there is a need of changing the amount of oxygen or the amount of nitrogen in the thickness direction of the film.

In the case of performing film formation using a single target (complex target) that includes a chromium region and a region containing the element added, the concentration of the element added may become uneven in the thickness direction of the chromium-containing material film. In some cases, for example, when the element added is indium, the concentration of indium in the chromium-containing material film may become more around the surface of the film but less in the inside of the film.

FIG. 1 is a diagram illustrating an example of results obtained by investigating distribution of indium in the chromium-containing material obtained from a chromium-indium by using electron spectroscopy for chemical analysis. In this figure, the vertical axis represents the composition ratio of indium to chromium.

This chromium-containing material film has a film thickness of 10 nm when it is prepared by film formation using a chromium-indium complex target. The concentration of indium in the inside of the film is 0.01 or less in terms of composition ratio. In contrast, however, the concentration of indium in the surface region corresponding to approximately ⅙ of the entire film thickness is significantly increased.

In the case of the sputtering film-formation of the chromium-containing material film of the present invention, therefore, such tendency should be taken into consideration when designing the film and setting the conditions for forming the film.

Conventionally, a chromium-containing material film has been used as a light-shielding film (Patent Literature 1 and 2), an etching mask film (Patent Literature 6: JP 2007-241060 A), an etching stopper film (Patent Literature 7: JP 2007-241065 A), or the like, which is included in a photo mask blank.

The use of the chromium-containing material film of the present invention as such a light-shielding film, an etching mask film, an etching stopper film, or the like allows the film to be provided with an improved dry etching rate while having the same characteristics as those of the conventional chromium-containing material film. For this reason, the patterning precision of the chromium-containing material film can be increased without performing any design change specific to the chromium-containing material film.

When using a chromium-containing material film added with tin is used as a light-shielding film as described above, the content of tin may be 0.5 atomic % or more with respect to the entire thickness of the light-shielding film. Alternatively, another embodiment may be configured such that the light-shielding film is formed of a laminated structure of an antireflection layer and a light-shielding layer, and provided as a film where only the antireflection layer has a tin content of 0.5 atomic % or more, or only the light-shielding layer has as a film having a tin content of 0.5 atomic % or more.

In order to allow the chromium-containing material film of the invention to exert more remarkable effects, the content of tin is more preferably 3 atomic % or more, still more preferably 5 atomic % or more. In the case of tin, different from other additive elements, the upper limit of the content thereof is not essentially restricted. However, since there is a possibility that optical characteristics or the like may be significantly changed when tin is excessively included, the content of tin is preferably 30 atomic % or less. Unless otherwise specified, it is preferred to set the content of tin to 20 atomic % or less as in the case of other additive elements.

When using the chromium-containing material film of a the present invention as a light-shielding film provided in a photo mask blank, as in the case of the conventional chromium-containing material film, a light element such as oxygen or nitrogen, or further carbon or hydrogen can be suitably added if needed to keep desired optical functions and chemical functions.

As described above, examples of a chromium-containing material (base material), which can be used in the present invention, can include a chromium oxide, a chromium nitride, a chromium carbide, a chromium oxynitride, and a chromium oxide carbide, a chromium nitride carbide, and a chromium oxide nitride carbide as well as a chromium metal. The above element can be incorporated in any of these base materials.

In the case of using the chromium-containing material film of the present invention as an antireflection layer or a light shielding layer, when the chromium-containing material is chromium oxynitride, the sum total of the chromium and the above element added is preferably 30 to 95 atomic %, particularly preferably 30 to 85 atomic %. Furthermore, the content of oxygen is preferably 0 to 60 atomic %, particularly preferably 5 to 50 atomic %. Furthermore, the content of nitrogen is preferably 0 to 30 atomic %, particularly preferably 3 to 30 atomic %. Here, the total content of oxygen and nitrogen is preferably 5 to 60 atomic %. The inclusion of oxygen enhances an effect of increasing the dry etching rate.

In the case that the chromium-containing material is chromium oxide nitride carbide when the chromium-containing material film of the present invention is used as an antireflection layer, the sum total of the chromium and the above element added is preferably 30 to 95 atomic %, particularly preferably 30 to 85 atomic %. Furthermore, the content of oxygen is preferably 0 to 60 atomic %, particularly preferably 5 to 50 atomic %. Furthermore, the content of nitrogen is preferably 0 to 30 atomic %, particularly preferably 3 to 30 atomic %. Furthermore, the content of carbon is preferably 1 to 30 atomic %. Here, the total content of oxygen and nitrogen is preferably 5 to 60 atomic %.

In the case that the chromium-containing material is chromium oxide nitride carbide when the chromium-containing material film of the present invention is used as a light-shielding layer, The sum total of the chromium and the above additive element is preferably 20 to 95 atomic %, particularly preferably 30 to 85 atomic %. Furthermore, the content of oxygen is preferably 0 to 60 atomic %, particularly preferably 5 to 50 atomic %. Furthermore, the content of nitrogen is preferably 0 to 30 atomic %, particularly preferably 3 to 30 atomic %. Furthermore, the content of carbon is preferably 1 to 30 atomic %. Here, the total content of oxygen and nitrogen is preferably 5 to 60 atomic %.

As a preferred chromium-containing material when the chromium-containing material film of the present invention is used as a hard mask film for microfabrication of a photo mask blank, a chromium compound containing chromium metal and also containing at least one or more light elements selected from chromium, oxygen, nitrogen, and carbon can be exemplified. Examples of such a chromium-containing material can include chromium oxide, chromium nitride, chromium oxynitride, chromium oxide carbide, chromium nitride carbide, and chromium oxide nitride carbide.

Such a chromium-containing material has a sum total of chromium and the above additive element of 50 atomic % or more, high resistance during fluorine-containing dry etching, and sufficient etch selectivity to a silicon-containing material. More preferably, the sum total of chromium and the above additive element is 60 atomic % or more.

In order to obtain high etch selectivity, the sum total of chromium and the above additive element in the chromium-containing material is preferably 50 atomic % or more and 100 atomic % or less, particularly preferably 60 atomic % or more and 100 atomic % or less. In addition, the content of oxygen is preferably more than zero atom % and 50 atomic % or less, particularly preferably more than zero atomic % and 40 atomic % or less. Furthermore, the content of nitrogen is preferably more than zero atomic % and 50 atomic % or less, particularly preferably more than zero atomic % and 40 atomic %. Furthermore, the content of carbon is preferably 0 atomic % or more and 20 atomic % or less, particularly preferably 0 atomic % or more and 10 atomic % or less. Such contents of the respective elements can provide the chromium-containing material with sufficiently high etch selectivity when it is used as an etching mask film.

In order to form a good resist pattern on the above chromium-containing material film, it is preferred that oxygen and/or nitrogen be contained in amount of 5 atomic % or more.

Furthermore, when the above chromium-containing material film is employed as an etching mask film formed on a photo mask blank used in production of a photo mask for forming a resist pattern of 50 nm or less, the film thickness is preferably 1 to 20 nm, particularly preferably 1 to 10 nm.

When using the chromium-containing material film of the present invention as an etching stopper film of a photo mask blank, the same material as that of the etching mask film can be selected.

If the thickness of the etching stopper film of such a material is set to 1 to 30 nm, good etching mask effect can be obtained without generating a problem of pitch dependency in processing of an etching mask film, and the etching precision of a film or a transparent substrate disposed below the etching mask film can be increased. If the thickness of an etching stopper film is set to 2 to 20 nm, a further preferable etching mask effect can be obtained.

As in the case of the conventional chromium-containing material film, the chromium-containing material film of the present invention can be subjected to dry etching using oxygen-containing chlorine gas. The chromium-containing material film of the present invention shows dominantly a more etching rate under the same conditions as those of the conventional chromium-containing material film. The dry etching can be carried out, for example, using a gas mixture of chlorine gas and oxygen gas at a mixture ratio ($Cl_2$ gas:$O_2$ gas) of 1:2 to 20:1 in terms of volumetric flow rate, and optionally mixed with inert gas such as helium.

A photo mask having high patterning precision can be produced by using the photo mask blank of the present invention and patterning a chromium-containing material film by a gas mixture containing at least chlorine and oxygen.

EXAMPLES

Example 1, Example 2, and Comparative Example 1

In the examples, film formation was performed on a square-shaped quartz substrate of 152 mm on a side and 6 mm in thickness by a DC sputtering method using a complex target having a chromium region and an indium region in a single target to obtain two different 10-nm thick CrN films (Cr:N=9:1) with the different concentrations of In (Example 1 and Example 2).

The content of indium in the CrN film was adjusted using two complex targets each having a different area ratio of the chromium region to the indium region in the target. Sputtering gas was a gas mixture of argon gas and nitrogen gas.

For comparison, furthermore, a CrN film containing no In was also formed using a Cr target (Comparative Example 1).

Two or more of each of the above three CrN film samples were produced. Analysis of the composition ratio of indium to chromium was determined by a time-of-flight secondary ion mass spectrometry apparatus (TRIFT III, manufactured by ULVAC-HI, Inc.)

Furthermore, an In-content distribution measurement in the film-thickness direction was carried out on another sample containing indium in high concentration by using ESCA (JPS-9000MC, manufactured by JEOL). Consequently, as described above, the segregation of In on the surface and a profile in the depth direction of In were observed as illustrated in FIG. 1.

These samples were compared with one another with respect to the dry-etching rate (clear time) of the CrN film of 10 nm in film thickness.

Figure 2:
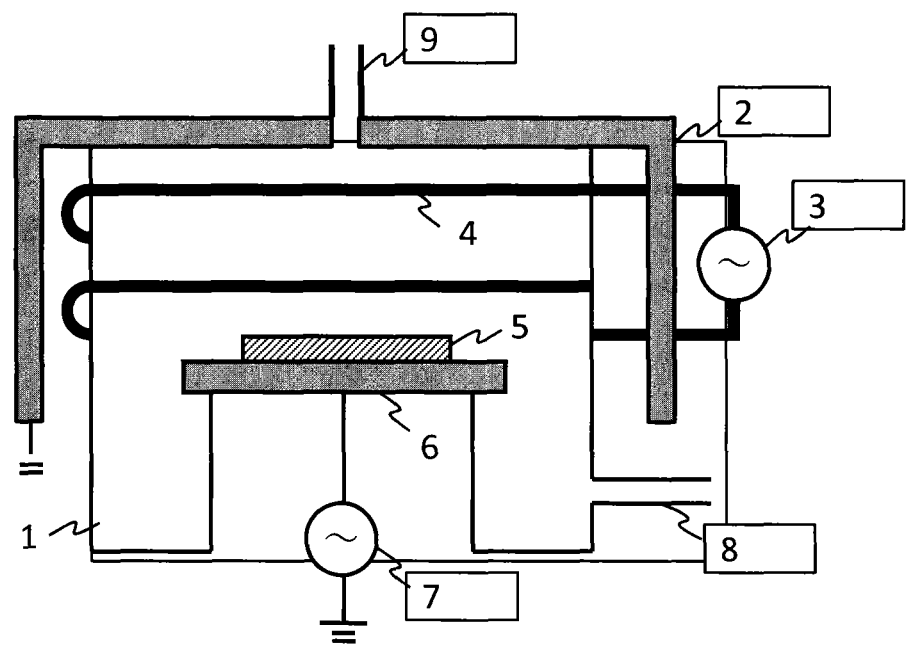
FIG. 2 is a diagram schematically illustrating the configuration of a device used for dry etching in examples.

FIG. 2 is a diagram schematically illustrating the configuration of a device used for chlorine-containing dry etching in this case. In the figure, reference numeral 1 denotes a chamber, 2 denotes a counter electrode, 3 denotes a high frequency oscillator for inductively coupled plasma (ICP), 4 denotes an antenna coil, 5 denotes a sample, 6 denotes a flat electrode, 7 denotes a RIE high frequency oscillator, 8 denotes an exhaust opening, and 9 denotes a gas inlet. Furthermore, the device configured as shown in FIG. 2 can be also used for fluorine-containing dry etching.

Etching was carried out under the following conditions: The inner pressure of the chamber was set to 6 mTorr, $Cl_2$ (185 sccm), $O_2$ (55 sccm), and He (9.25 sccm) were supplied as etching gas, a voltage of 700 V (pulse) was applied to the RIE high frequency oscillator, and a power of 400 W (continuous discharge) was supplied to the ICP-generation high frequency oscillator.

Clear times of the respective samples of Example 1 and Example 2 when chlorine-containing dry etching was carried out under the above conditions were obtained from reflectance measurements on the samples and then compared with a clear time value of the sample of the comparative example which was set to 1. In Table 1, the results of the comparison are shown.

TABLE 1

| | In concentration (atomic %) | | |
| Sample | Surface | Substrate surface side | Clear time (Relative value) |
| --- | --- | --- | --- |
| Example 1 | 0.24% | 0.02% | 0.88 |
| Example 2 | 4.60% | 0.29% | 0.86 |
| Comparative Example 1 | 0.00% | 0.00% | 1 |

As is evident from the above comparison results, any of the samples of Example 1 and Example 2, which contain Indium in their CrN films, shows an increased etching rate during the chlorine-containing dry etching as compared with the comparative example sample containing no In.

Example 3, Example 4, and Comparative Example 2

In the examples, film formation was performed on a square-shaped quartz substrate of 152 mm on a side and 6 mm in thickness by a DC sputtering method using co-sputtering with a chromium target and a tin target which were independently disposed to obtain two different 44-nm thick CrON films with different tin concentration (Example 3 and Example 4).

The content of tin in the CrON film was adjusted by adjusting the applied power ratio between the chromium target and the tin target. Furthermore, sputtering gas was a gas mixture of argon gas with oxygen gas and nitrogen gas at a ratio of argon gas:nitrogen gas:oxygen gas=5:6:3.

For comparison, furthermore, a CrON film containing no Sn was also formed using a Cr target in a manner similar to the above description (Comparative Example 2). In Comparative Example 2, the composition ratio of Cr, O, and N was Cr:O:N=5:3;2. Furthermore, the sum totals of the respective composition ratios of Cr and Sn (atomic %) in Comparative Example 2 and Examples 3 and 4 were almost the same.

Two or more of each of the above three samples of the inorganic material films were produced. The composition analysis of the inorganic material films was carried out using ESCA (JPS-9000MC, manufactured by JEOL).

Each of these samples was compared with the chlorine-containing dry etching rate (clear time) of an inorganic material film of 44 nm in film thickness.

The configuration of a device used for the chlorine-containing dry etching was the same as Examples 1 and 2.

Etching was carried out under the following conditions: The inner pressure of the chamber was set to 6 mTorr, $Cl_2$ (185 sccm), $O_2$ (55 sccm), and He (9.25 sccm) were supplied as etching gas, a voltage of 700 V (pulse) was applied to the RIE high frequency oscillator, and a power of 400 W (continuous discharge) was supplied to the ICP-generation high frequency oscillator.

Clear times of the respective samples of Example 3 and Example 4 when chlorine-containing dry etching was carried out under the above conditions were obtained from reflectance measurements on the samples and then compared with a clear time value of the sample of Comparative Example 2 which was set to 1. In Table 2, the results of the comparison are shown.

TABLE 2

| Sample | Sn content (atomic %) | Clear time (Relative value) |
|---|---|---|
| Example 3 | 7.7% | 0.63 |
| Example 4 | 4.5% | 0.85 |
| Comparative Example 2 | 0.0% | 1 |

As is evident from the above comparison results, any of the samples of Example 3 and Example 4, which contain tin in their CrON films, shows an increased etching rate during the chlorine-containing dry etching as compared with the comparative example sample containing no Sn.

These samples were compared with one another with respect to the dry-etching rate (clear time) of the CrON film of 44 nm in film thickness.

Etching was carried out under the following conditions: The inner pressure of the chamber was set to 5 mTorr, $SF_6$ (18 sccm) and $O_2$ (45 sccm) were supplied as etching gas, a voltage of 54 W (continuous discharge) was applied to the RIE high frequency oscillator, and a power of 325 W (continuous discharge) was supplied to the ICP-generation high frequency oscillator.

Clear times of the respective samples of Example 1 and Example 2 when fluorine-containing dry etching was carried out under the above conditions were obtained from reflectance measurements on the samples of Examples 1 and 2. Then, the clear times of the respective samples were compared with respect to the ratio ($A_T=T_F/T_{CL}$) of clear time ($T_F$) of the fluorine-containing dry etching to the clear time ($T_{CL}$) of the chlorine-containing dry-etching. The results of the comparison are shown in Table 3.

The ratio of etching rate is inversely proportional to the ratio of clear time. The ratio ($A_E=R_F/R_{CL}$) of the fluorine-containing dry-etching rate ($R_F$) to the chlorine-containing dry etching ($R_{CL}$) is represented by the relational equation: $A_T=1/A_E$.

TABLE 3

| Sample | Sn content (atomic %) | Clear time ratio ($T_F/T_{CL}$) |
|---|---|---|
| Example 3 | 7.7% | 13.6 |
| Example 4 | 4.5% | 11.1 |
| Comparative Example 2 | 0.0% | 10.3 |

As is evident from the above comparison results, any of the samples of Example 3 and Example 4, which contain Indium in their CrON films, shows an increased ratio of the clear time of the fluorine-containing dry etching to the clear time of the chlorine-containing dry etching during the chlorine-containing dry etching as compared with the comparative example sample containing no Sn (Comparative Example 2). In other words, the difference between the chlorine-containing dry etching rate and the fluorine-containing dry etching rate becomes large, causing an increase in performance of the film as a hard mask.

As described above, the inorganic material film of the present invention contains tin in the chromium-containing material. Thus, the etching rate during the chlorine-containing dry etching can be increased as compared with the conventional inorganic film containing no tin.

When using the inorganic material film of the present invention as such a light-shielding film, an etching mask film, an etching stopper film, or the like, the film can be provided with an improved dry etching rate while having the same characteristics as those of the conventional inorganic material film. As a result, the patterning precision of the inorganic material film can be increased without performing any design change specific to the inorganic material film.

By carrying out chlorine-containing dry etching on the inorganic material film using the photo mask blank provided with the inorganic material film, it becomes possible to carry out fine patterning with a decreased damage on a photo resist. Therefore, it becomes possible to produce a photo mask with high pattern accuracy.

Comparative Example 3, Comparative Example 4, and Comparative Example 5

In the comparative examples, in a manner similar to Example 3 and Example 4, film formation was performed on a square-shaped quartz substrate of 152 mm on a side and 6 mm in thickness by a DC sputtering method using co-sputtering with a chromium target and a tin target which were independently disposed to obtain a 44-nm thick CrON film containing Ni, Zn, and Cu in amount of about 3 atomic %.

The contents of Ni, Zn, and Cu in the CrON film were adjusted by adjusting the applied power on the chromium target and Ni, Zn, and Cu targets. Sputtering gas was a gas mixture of argon gas, oxygen gas, and nitrogen gas.

Two or more of each of the above three samples of the inorganic material films were produced. The composition analysis of the inorganic material films was carried out using ESCA (JPS-9000MC, manufactured by JEOL).

Each of these samples was compared with the chlorine-containing dry etching rate (clear time) of an inorganic material film of 44 nm in film thickness.

The configuration of a device used for the chlorine-containing dry etching was the same as the above examples.

Etching was carried out under the following conditions: The inner pressure of the chamber was set to 6 mTorr, $Cl_2$ (185 sccm), $O_2$ (55 sccm), and He (9.25 sccm) were supplied as etching gas, a voltage of 700 V (pulse) was applied to the RIE high frequency oscillator, and a power of 400 W (continuous discharge) was supplied to the ICP-generation high frequency oscillator.

Clear times of the respective samples of Comparative Examples 3 to 5 when chlorine-containing dry etching was carried out under the above conditions were obtained from reflectance measurements on the samples and then compared with a clear time value of the sample of Comparative Example 2 which was set to 1. In Table 4, the results of the comparison are shown.

TABLE 4

| Sample | Element added | Clear time |
|---|---|---|
| Comparative Example 3 | Ni | not etched |
| Comparative Example 4 | Zn | 4.2 |
| Comparative Example 5 | Cu | not etched |

As described above, in the chromium-containing material film of the present invention, an element is added thereto and is capable of bringing a mixture of the element and the chromium into a liquid phase at a temperature of 400° C. or lower. Comparing with the conventional chromium-containing metal film, therefore, an etching rate during the chlorine-containing dry etching simultaneously including chlorine and oxygen is improved.

By using such a chromium-containing material film as an optical film (e.g., a light-shielding film, an etching mask film, or an etching stopper film) of a photo mask blank, the patterning precision can be improved while the optical characteristics and the like of the conventional chromium-containing material film can be kept as it is.

INDUSTRIAL APPLICABILITY

The present invention provides a novel technique for increasing the dry-etching rate of a film made of a chromium-containing material while assuring design flexibility of the film.

REFERENCE SINS LIST

1 Chamber
2 Counter electrode
3 High frequency oscillator for ICP generation
4 Antenna coil
5 Sample
6 Flat electrode
7 RIE high frequency oscillator
8 Exhaust opening
9 Gas inlet

The invention claimed is:

1. A photo mask blank comprising a film comprising chromium and another element, wherein the other element is capable of bringing a mixture of the other element and the chromium into a liquid phase at a temperature of 400° C. or lower, and wherein the other element is indium or tin.

2. The photo mask blank according to claim 1, wherein the film has a region in a thickness direction thereof in which the other element is present at a concentration of 0.01 atomic % to 20 atomic %.

3. The photo mask blank according to claim 2, wherein the region in the thickness direction has a thickness of 50% or more of a total film thickness of the film.

4. The photo mask blank according to claim 1, wherein the chromium is present in the form of a chromium metal, a chromium oxide, a chromium nitride, a chromium carbide, a chromium oxynitride, a chromium oxycarbide, a chromium carbonitride, or a chromium oxycarbonitride.

5. The photo mask blank according to claim 1, wherein the film is a light-shielding film, an etching mask film, or an etching stopper film.

6. The photo mask blank according to claim 5, wherein the film is a light-shielding film having a laminated structure comprising an antireflection layer and a light-shielding layer, and at least one of the antireflection layer and the light-shielding layer has a region in which the other element is present at a concentration of 0.01 atomic % to 20 atomic % relative to chromium, and the other element is capable of bringing a mixture of the other element and the chromium into a liquid phase at a temperature of 400° C. or lower.

7. The photo mask blank according to claim 1, wherein a ratio $(R_{Cl}/R_F)$ of a chlorine dry etching rate $(R_{Cl})$ and a fluorine dry etching rate $(R_F)$ of the film is higher than that of a chromium film free of the other element.

8. The photo mask blank according to claim 1, wherein the film is formed by a process of co-sputtering in which a chromium target and a target comprising the other element are simultaneously sputtered.

9. A method for manufacturing a photo mask, comprising patterning the photo mask blank of claim 1 by contacting the firm with a gas mixture comprising chlorine and oxygen.

10. The photo mask blank according to claim 1, wherein the other element is indium.

11. The photo mask blank according to claim 1, wherein the other element is tin.

12. The photo mask blank according to claim 1, wherein the film is 1 to 20 nm thick.

13. A photo mask blank comprising a film comprising chromium and tin, wherein the film has a region in a thickness direction thereof comprising tin at a concentration of 0.5 atomic % or more.

14. The photo mask blank according to claim 13, wherein the film is a light-shielding layer having a laminated structure comprising an antireflection layer and a light-shielding layer, and at least one of the antireflection layer and the light-shielding layer comprises tin.

15. A method for manufacturing a photo mask, comprising patterning the photo mask blank of claim 13 by contacting the film with a gas mixture comprising chlorine and oxygen.

16. A film mainly comprising chromium, and further comprising another element, wherein the other element is capable of bringing a mixture of the other element and the chromium into a liquid phase at a temperature of 400° C. or lower, and wherein the other element is indium or tin.

17. The film according to claim 16, having a region in a thickness direction thereof in which the other element is present at a concentration of 0.01 atomic % to 20 atomic %.

18. The film according to claim 17, wherein the region in the thickness direction has a thickness of 50% or more of a total film thickness of the film.

19. The film according to claim 17, wherein the chromium is present in the form of a chromium metal, a chromium oxide, a chromium nitride, a chromium carbide, a chromium oxynitride, a chromium oxycarbide, a chromium carbonitride, or a chromium oxycarbonitride.

20. The film according to claim 17, wherein the film is 1 to 20 nm thick.

* * * * *